United States Patent
Ahmed et al.

(10) Patent No.: US 9,419,039 B2
(45) Date of Patent: Aug. 16, 2016

(54) PHOTODIODE INSULATION STRUCTURE

(71) Applicant: STMicroelectronics (Crolles 2) SAS, Crolles (FR)

(72) Inventors: Nayera Ahmed, Crolles (FR); Francois Roy, Seyssins (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 14/644,795

(22) Filed: Mar. 11, 2015

(65) Prior Publication Data

US 2015/0279878 A1    Oct. 1, 2015

(30) Foreign Application Priority Data

Mar. 25, 2014    (FR) ...................................... 14 52482

(51) Int. Cl.
    *H01L 27/146*    (2006.01)
(52) U.S. Cl.
    CPC ...... *H01L 27/1463* (2013.01); *H01L 27/14643* (2013.01); *H01L 27/14685* (2013.01); *H01L 27/14689* (2013.01); *H01L 27/14698* (2013.01)
(58) Field of Classification Search
    CPC ..................... H01L 27/1463; H01L 27/14643
    USPC ................. 257/446, 461, E33.076; 438/430
    See application file for complete search history.

(56) References Cited

U.S. PATENT DOCUMENTS

| | | | |
|---|---|---|---|
| 2001/0021559 A1* | 9/2001 | Norstrom | H01L 21/26513 438/296 |
| 2006/0043437 A1* | 3/2006 | Mouli | H01L 27/14683 257/291 |
| 2007/0102740 A1 | 5/2007 | Ellis-Monaghan et al. | |
| 2008/0102557 A1 | 5/2008 | Kim et al. | |
| 2008/0157150 A1* | 7/2008 | Shim | H01L 27/14603 257/292 |
| 2008/0217719 A1* | 9/2008 | Liu | H01L 27/14689 257/446 |
| 2009/0266973 A1 | 10/2009 | Roy et al. | |
| 2010/0289107 A1 | 11/2010 | Regolini et al. | |
| 2011/0156186 A1 | 6/2011 | Iida et al. | |
| 2012/0033119 A1 | 2/2012 | Shinohara | |
| 2012/0280109 A1 | 11/2012 | Mao et al. | |
| 2014/0291481 A1* | 10/2014 | Zhang | H04N 5/361 250/208.1 |

OTHER PUBLICATIONS

Tournier, A. et al., "Pixel-to-Pixel isolation by Deep Trench technology: Application to CMOS Image Sensor," International Image Sensor Workshop, 2011, 4 pgs.

* cited by examiner

*Primary Examiner* — Kimberly Rizkallah
*Assistant Examiner* — Maria Ligai
(74) *Attorney, Agent, or Firm* — Seed IP Law Group PLLC

(57) ABSTRACT

A structure of insulation between photodiodes formed in a doped semiconductor layer of a first conductivity type extending on a doped semiconductor substrate of the second conductivity type, the insulating structure including a trench crossing the semiconductor layer, the trench walls being coated with an insulating layer, the trench being filled with a conductive material and being surrounded with a P-doped area, more heavily doped than the semiconductor layer.

19 Claims, 4 Drawing Sheets

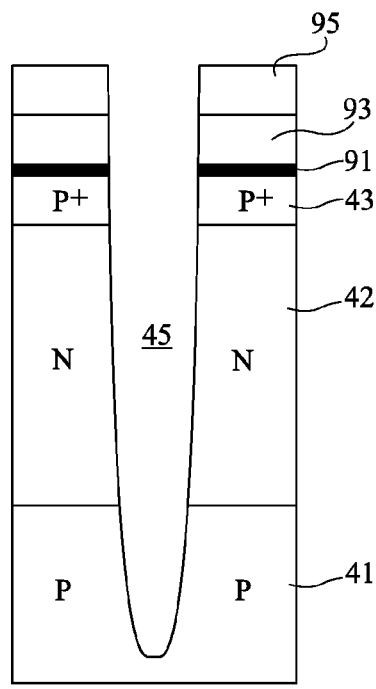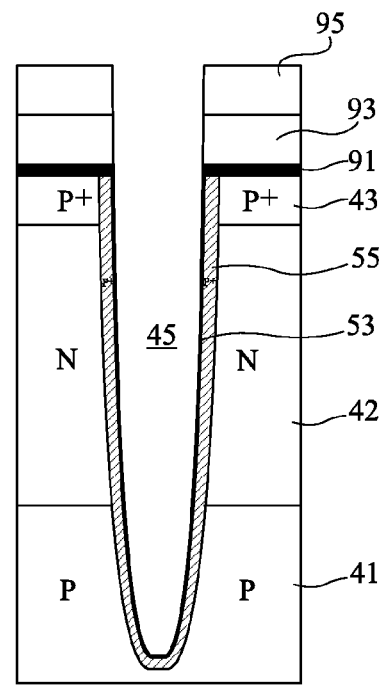
Fig 7A    Fig 7B
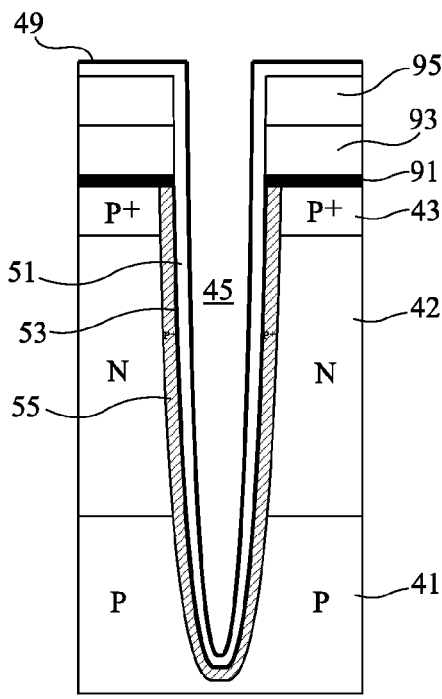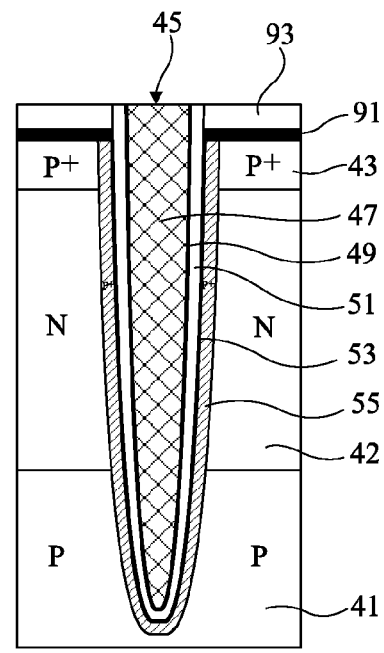
Fig 7C    Fig 7D

PHOTODIODE INSULATION STRUCTURE

BACKGROUND

1. Technical Field

The present disclosure relates to insulating trenches and their use to insulate a photodiode of an image sensor.

2. Description of the Related Art

Conventionally, an image sensor comprises a pixel array, each pixel comprising a photosite such as a photodiode and various read, transfer, reset, and other transistors. Each photodiode comprises a semiconductor region for the photogeneration of charge carrier. When the photodiode is illuminated, photogenerated charges build up in the photogeneration region and are then transferred to a read circuit by a transfer transistor associated with the photodiode.

To avoid any crosstalk between neighboring pixels, an insulating trench, currently called DTI ("Deep Trench Isolation") in the art, is formed around each photodiode of the image sensor.

The simplest photodiode insulation structure comprises a trench filled with silicon oxide. This structure has disadvantages. Particularly, the current photogenerated by the photodiode is smaller than what it should theoretically be. Further, the photodiode has a high dark current.

It would be desirable to provide a trench structure for insulating a photodiode such that the dark current of the photodiode is as low as possible and that the intensity of the photogenerated current of this photodiode is as high as possible.

BRIEF SUMMARY

Thus, an embodiment provides a structure of insulation between photodiodes formed in a doped semiconductor layer of a first conductivity type extending on a doped semiconductor substrate of the second conductivity type, the insulation structure comprising a trench crossing the semiconductor layer, the walls of the trench being coated with an insulating layer, the trench being filled with a conductive material and being surrounded with a P-doped area, more heavily doped than the semiconductor layer.

According to an embodiment, the conductive material is coupled with a contact of connection to a negative or zero bias voltage.

According to an embodiment, the thickness of the insulating layer is greater than 25 nm.

According to an embodiment, the insulating layer comprises a thermal oxide layer, a deposited oxide layer, and a silicon nitride layer.

According to an embodiment, the conductive material is doped polysilicon.

According to an embodiment, the first conductivity type is type N.

An embodiment provides a method of manufacturing an insulating structure comprising the successive steps of:
  etching a trench in a stack of semiconductor layers;
  implanting a P dopant from the trench to form a P-type area surrounding the trench walls;
  thermally forming a first oxide layer on the trench walls;
  depositing a second oxide layer;
  depositing a silicon nitride layer; and
  filling the trench with a conductive material.

According to an embodiment, the manufacturing method further comprises forming a contact of connection to a bias voltage connected to the conductive material.

The foregoing and other features and advantages will be discussed in detail in the following non-limiting description of specific embodiments in connection with the accompanying drawings.

BRIEF DESCRIPTION OF THE SEVERAL VIEWS OF THE DRAWINGS

FIGS. 7A to 7D are simplified cross-section views illustrating steps of the manufacturing of an embodiment of an insulating trench.

For clarity, the same elements have been designated with the same reference numerals in the various drawings and the various drawings are not to scale.

DETAILED DESCRIPTION

Figure 1:
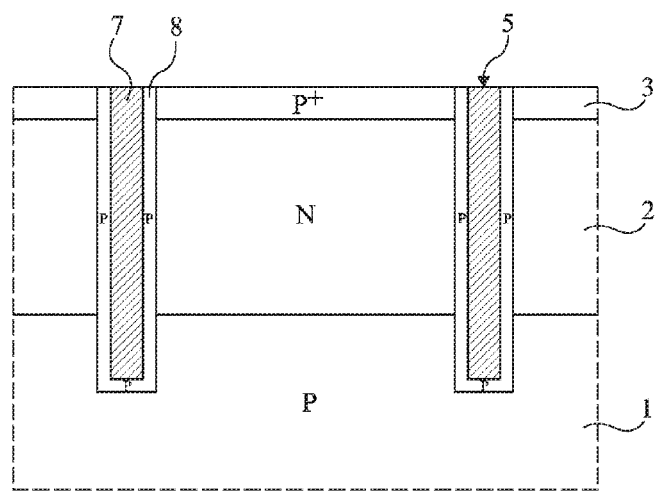
FIG. 1 is a simplified cross-section view of an example of a trench of insulation between neighboring photodiodes.

FIG. 1 is a simplified cross-section view of an example of an insulation trench between neighboring photodiodes, such as described in patent application US 2010/289107 of the applicant.

Each photodiode comprises, on a P-type doped semiconductor substrate 1, an N-type doped semiconductor photogeneration region 2 generally topped with a heavily-doped P-type doped semiconductor layer 3 ($P^+$). Each photodiode is laterally insulated from the neighboring photodiodes by a trench 5 filled with an insulating material 7, for example, silicon oxide. A P-type doped area 8 is formed along the walls of each trench 5. Trenches 5 extend from the surface of the structure into substrate 1. Such a structure enables to decrease the disadvantages due to the use of a trench filled with silicon oxide.

Figure 2:
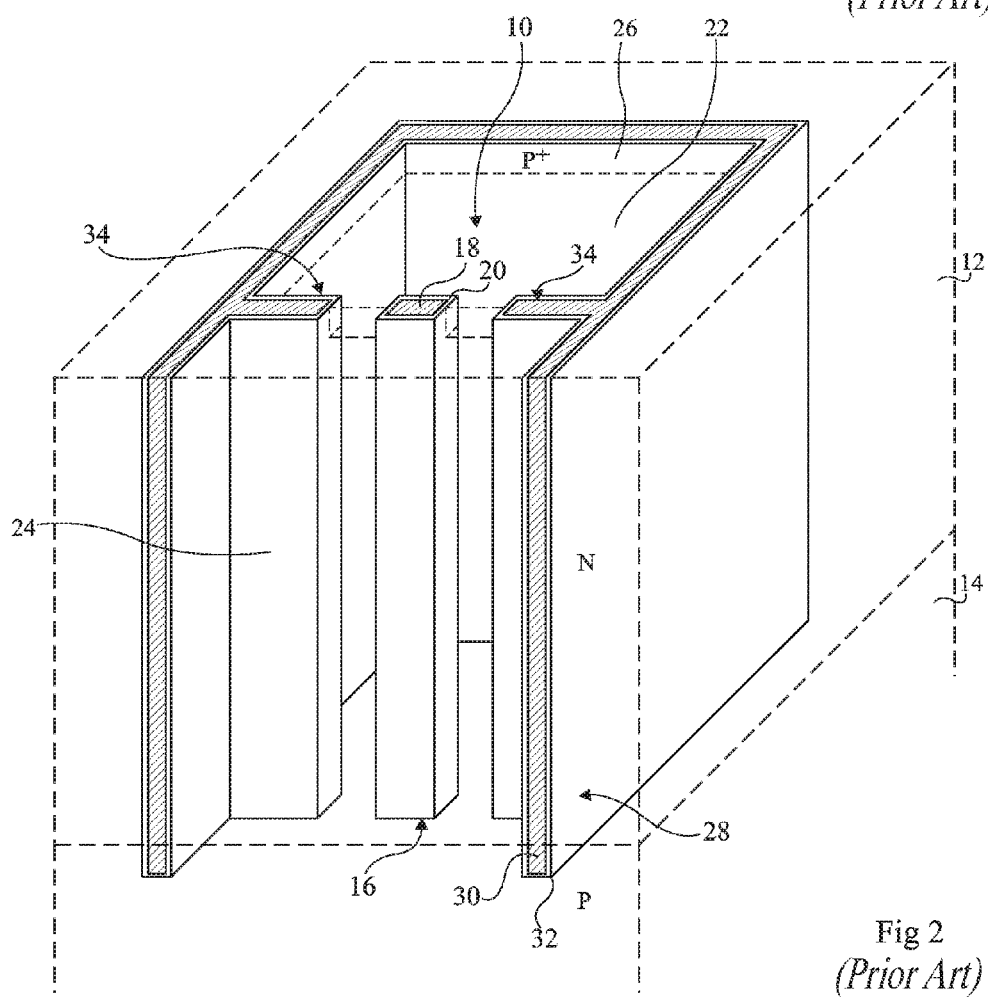
FIG. 2 corresponds to FIG. 2 of patent application US 2009/266973.

FIG. 2 corresponds to FIG. 2 of patent application US 2009/266973 of the applicant. This drawing is a perspective view schematically showing a photodiode 10 associated with a vertical transistor for transferring the photogenerated charges. Photodiode 10 and transfer transistor are formed in an N-type semiconductor layer 12 which extends on a P-type semiconductor substrate 14. The gate of the transfer transistor comprises a column 16 filled with a conductive material 18 surrounded with a dielectric layer 20. Column 16 crosses layer 12 all the way to substrate 14 and is formed between a charge photogeneration region 22 of layer 12 which forms the transistor source and a region 24 of layer 12 which forms the transistor drain. Photogeneration region 22 may be topped with a heavily-doped P-type semiconductor layer 26 ($P^+$).

A wall 28 made of a conductive material 30 coated with a dielectric layer 32 crosses layer 12 all the way to substrate 14 and laterally delimits the assembly of photodiode 10 and of the transfer transistor. Extensions 34 of wall 28 extend towards gate 16, between regions 22 and 24 of layer 12. To store or to transfer photogenerated charges, an alternately positive and negative voltage, for example, −1 V and 2.5 V, is applied to conductive material 18 of gate 16 while photodiode 10 is in operation. The application of a negative voltage causes an insulation between regions 22 and 24 and the storage of charges in photogeneration region 22. The application of a positive voltage causes the forming of a channel along the gate walls and the transfer of the charges stored in photogeneration region 22 to drain region 24 of the transistor. For the gate to have an effective action, the thickness of dielectric layer 20, and thus of dielectric layer 32, should be as small as possible, typically smaller than 15 nm. This has the disadvantage that oblique light rays reaching photogeneration region 22 and hitting layers 20 and 32 are partially lost, which adversely affects the quantum efficiency of the photodiode.

It would be desirable to provide a trench structure for insulating a photodiode such that the photodiode dark current is as low as possible and that the intensity of the photogenerated current of this photodiode is as high as possible.

Figure 3:
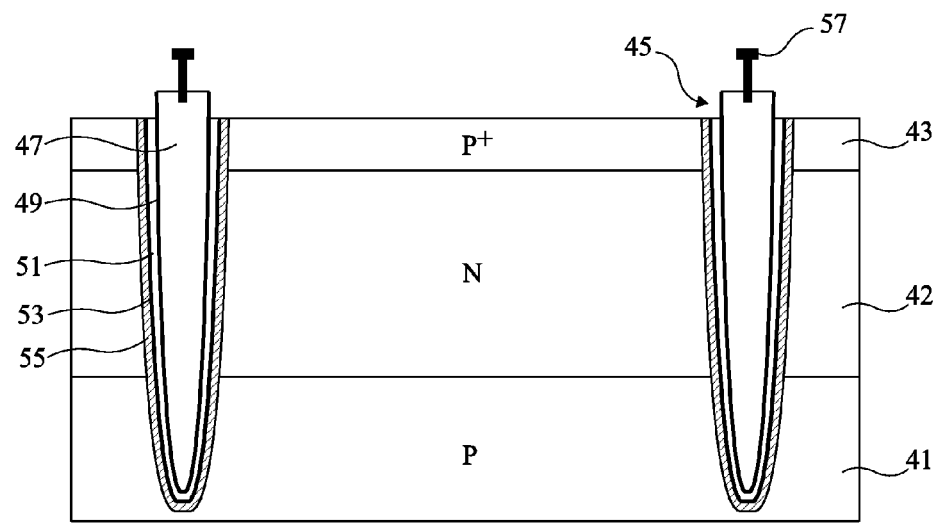
FIG. 3 is a simplified cross-section view of an embodiment of a trench of insulation between neighboring photodiodes.

FIG. 3 is a simplified cross-section view of an embodiment of an insulating trench formed between a photodiode and partially-shown neighboring photodiodes.

Each photodiode comprises, on a P-type semiconductor substrate 41, an N-type doped semiconductor photogeneration region 42 topped with a heavily-doped P-type doped semiconductor layer 43 (P⁺). As an example, substrate 41 is made of silicon and has a dopant concentration in the range from $10^{14}$ to $10^{19}$ at./cm³. Region 42 may have a thickness in the range from 0.3 to 3 µm and may be formed by implantation/diffusion of dopants in substrate 41. Region 42 may also be formed by epitaxy on substrate 41. The dopant concentration of N-type region 42 may be in the range from $10^{15}$ to $5*10^{17}$ at./cm³. The dopant concentration of P⁺ region 43 may be greater than $5*10^{19}$ at./cm³, where region 43 may be formed with a thickness smaller than 0.5 µm by implantation/diffusion of dopants in region 42.

Each photodiode is laterally insulated from neighboring photodiodes by a peripheral trench 45 surrounding regions 43 and 42 and penetrating into substrate 41. Each trench is filled with a conductive material 47 surrounded with an insulating coating selected to achieve a capacitive effect between the substrate and the conductive material separated from each other by the insulating coating. In the shown example, the insulating coating successively comprises, from the inside to the outside of the trench, a diffusion barrier layer 49, for example, silicon nitride or silicon oxynitride, a deposited silicon oxide layer 51, and a thermal silicon oxide layer 53. A heavily-doped P-type area 55 (P⁺) surrounds the walls of the insulated trench. Conductive material 47 filling the trench is connected to a contact 57.

In operation, contact 57 is coupled to a zero or negative voltage, for example, 0 or –1 V.

As an example, the width of trench 45 is in the range from 0.1 to 0.5 µm, for example, 0.35 µm. Conductive material 47 may be doped polysilicon having a dopant concentration greater than $5*10^{18}$ at./cm³. Diffusion barrier layer 49 may be a silicon nitride or silicon oxynitride layer having a thickness in the range from 0.2 to 0.5 nm, for example, 0.25 nm. The thickness of deposited oxide layer 51 may be in the range from 15 to 25 nm, for example, 17.5 nm. The thickness of thermal oxide layer 53 may be in the range from 5 to 10 nm, for example, 7.5 nm.

The total thickness of insulating layers 49, 51, and 53 is greater than 25 nm, which is sufficient so that, in operation, oblique light rays reaching layer 53 are almost totally reflected and sent back to photogeneration region 42. Thus, the quantum efficiency, and thus the photogenerated current, of a photodiode insulated by a trench of the type in FIG. 3, is higher than that of a photodiode of the type in FIG. 2. Further, the presence of diffusion barrier layer 49 enables to avoid any diffusion of the dopants of conductive material 47 through layers 49, 51, and 53.

Figure 4:
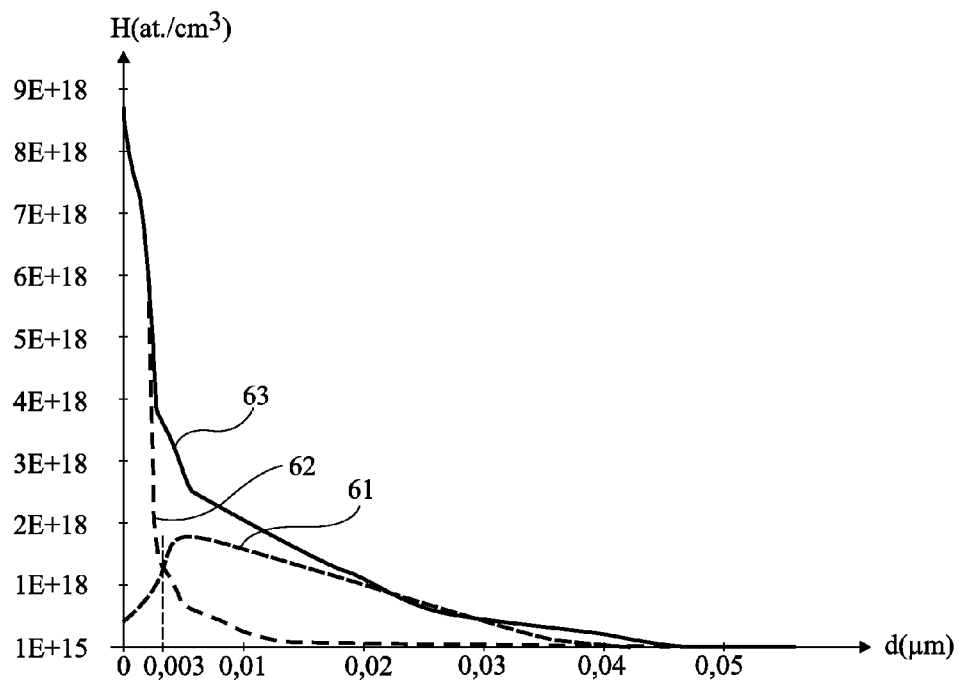
FIG. 4 shows the variation of the hole density in the vicinity of the walls of different types of insulating trenches.

FIG. 4 illustrates the variation of hole density H in at./cm³ in the charge photogeneration region of a photodiode according to distance d in µm, starting from the external wall of an insulating trench of the photodiode:
  for a trench filled with silicon oxide and surrounded with a P⁺ area (curve 61),
  for an insulated trench filled with a conductive material of the type in FIG. 2 biased to –1 V (curve 62), and
  for a trench of the type in FIG. 3 biased to 0 V (curve 63).

In the case of curve 61, the hole density is low next to the trench, that is, for a distance d smaller than 0.003 µm, and then increases up to a value in the order of $2*10^{18}$ at./cm³ before decreasing as the distance from the trench increases.

In the case of curve 62, the hole density starts from a value slightly lower than $8*10^{18}$ at./cm³ in the immediate vicinity of the trench and rapidly decreases as the distance from the trench increases.

In the case of curve 63, the hole density starts from a value slightly greater than $8*10^{18}$ at./cm³ in the immediate vicinity of the trench and decreases less rapidly than in the case of curve 62 as the distance from the trench increases.

Figure 5:
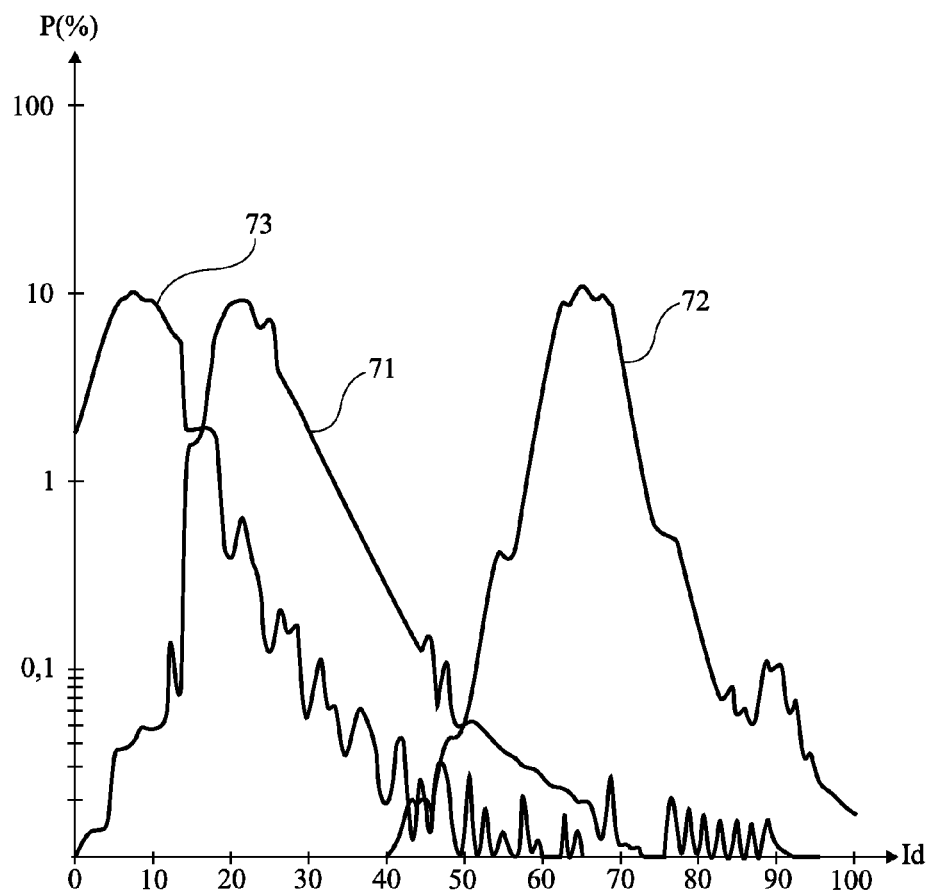
FIG. 5 shows the dark current distribution for photodiodes insulated by different types of insulating trenches.

FIG. 5 shows distribution P in % of dark current Id in an arbitrary linear scale for photodiodes of pixel arrays in the three following cases:
  photodiodes insulated by trenches filled with silicon oxide and surrounded with a P⁺ area of the type in FIG. 1 (curve 71),
  photodiodes insulated by insulating trenches filled with a conductive material of the type in FIG. 2, biased to –1 V (curve 72), and
  photodiodes insulated by insulating trenches filled with a conductive material and surrounded with a P⁺ area of the type in FIG. 3 biased to 0 V (curve 73).

It can be seen that, in the case of pixel arrays where the photodiodes are insulated from one another by trenches of the type in FIG. 3, biased to 0 V (curve 73), the number of photodiodes having a low dark current is greater than in the case where the photodiodes are insulated by trenches filled with oxide surrounded with a P⁺ area (curve 71) or with insulating trenches filled with a conductive material and biased to –1 V (curve 72).

It should be noted that, if a trench of the type in FIG. 3 was used by leaving conductive material 47 floating, that is, unbiased, the dark current distribution would be close to that of curve 71. One of the desired advantages, that is, a low dark current, would thus not be obtained.

Figure 6:
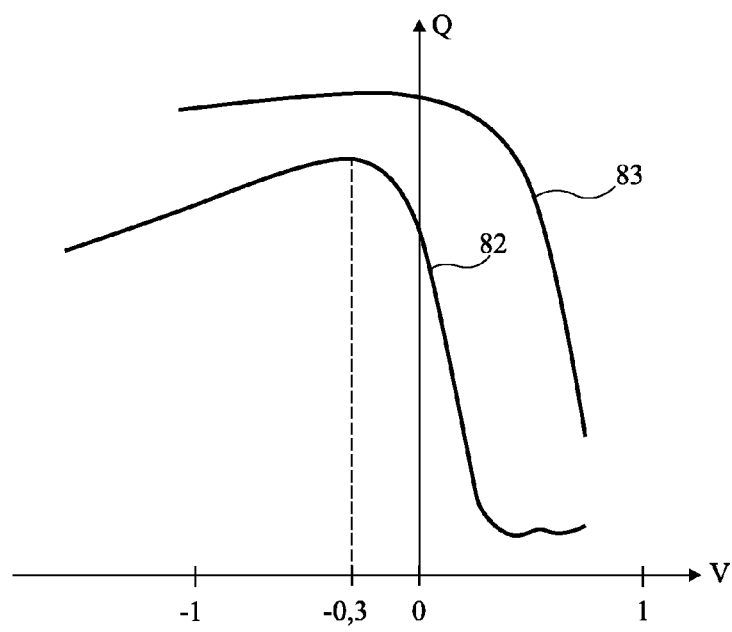
FIG. 6 shows the quantity of holes in a photodiode in the vicinity of two different types of insulating trenches according to the bias voltage applied to the conductive material filling these trenches.

FIG. 6 shows the amount of holes Q in arbitrary linear scale in the vicinity of an insulated trench of the type in FIG. 2 (curve 82) and of a trench of the type in FIG. 3 (curve 83) according to voltage V in volts applied to the conductive material of these trenches.

In the case of curve 82, the amount of holes is maximum for a negative voltage equal to –0.3 V and strongly drops for a 0-V voltage.

In the case of curve 83, the amount of holes is maximum and substantially constant for voltages in the range from –1 V to 0 V, the amount of holes decreasing for voltages greater than 0 V. Further, the maximum value of the number of holes of curve 83 is greater than that of curve 82.

Thus, for an optimum use of an insulating trench of the type in FIG. 2, the conductive material should be biased to a negative voltage while, for an optimal use of a trench of the type in FIG. 3, the conductive material should only be biased to a 0 voltage. This enables to avoid having to provide a negative power supply voltage.

FIGS. 7A to 7D are simplified cross-section views illustrating manufacturing steps of the manufacturing according to an embodiment of an insulating trench of the type in FIG. 3.

At the step illustrated in FIG. 7A, the semiconductor stack of substrate 41 and of layers 42 and 43 has been successively coated with an insulating layer 91, with an insulating layer 93, and with a masking layer 95, and a trench 45 has been formed by plasma etching. The trench crosses layers 95, 93, 91, 43, and 42 and penetrates into substrate 41. Trench 45 may have a width in the range from 0.2 to 0.5 μm. Insulating layer 93 may be a silicon nitride layer having a thickness in the range from 80 to 100 nm, for example, 90 nm. Insulating layer 91 may be a silicon oxide layer having a thickness in the range from 25 to 30 nm, for example, 28 nm.

FIG. 7B shows the structure of FIG. 7A after forming by implantation of a heavily-doped P-type area 55 ($P^+$) along the walls of trench 45 and after forming of a thin thermal oxide layer 53 on the internal walls of the trench.

Area 55 is formed by oblique implantation of P-type dopant atoms, followed by a diffusion step. As an example, an implantation from $BF_2$ and carbon may be used. Silicon oxide layer 53 formed in a rapid thermal oxidation step may have a thickness in the range from 5 to 10 nm, for example, 7.5 nm.

In FIG. 7C, an insulating layer 51, followed by a diffusion barrier layer 49, have been conformally deposited on the structure shown in FIG. 7B. As an example, insulating layer 51 is a silicon oxide layer deposited, for example, by chemical vapor deposition using a precursor such as TEOS (tetraethylorthosilicate). The thickness of deposited oxide layer 51 may be in the range from 15 to 25 nm, for example, 17.5 nm. Diffusion barrier layer 49 may be a silicon nitride layer or a silicon oxynitride layer having a thickness in the range from 0.2 to 0.5 nm, for example, 0.25 nm, where layer 49 may be formed by chemical vapor deposition.

FIG. 7D shows the structure of FIG. 7C after the filling of trench 45 with a conductive material 47, followed by a chem.-mech. polishing of the upper surface of this structure to obtain a planar surface. Conductive material 47 may be heavily-doped polysilicon, for example, of type P, formed by chemical vapor deposition.

An additional step of etching layers 91 and 93 may be carried out so that a portion of conductive material 47 protrudes by a few tens of nanometers above layer 43 as illustrated in FIG. 3. A contact 57 of application of a voltage to conductive material 47 may be formed on this portion of the trench (see FIG. 3).

Specific embodiments have been described. Various alterations, modifications, and improvements will occur to those skilled in the art. In particular, although, in FIGS. 3 and 7A to 7D, a photodiode comprising a heavily-doped P-type layer 43, that is, a "pinned" photodiode, has been shown, an insulating trench such as described herein may be used to insulate any known type of photodiode. For example, a photodiode free of layer 43 may be considered.

The numerical values of dimensions and dopings given in the previous description are provided as non-limiting examples only. Further, the conductivity types of substrate 41 and of layers 42 and 43 may all be inverted. The materials of the previously-described layers and regions may be modified. Further, although a semiconductor silicon layer has been described, it may also be made of another semiconductor material, for example, germanium or a silicon-germanium mixture. The insulating coating formed on the trench walls is not limited to the specific materials described herein, but may for example comprise a hafnium oxide layer ($HfO_2$.

The steps of the manufacturing method described in relation with FIGS. 7A to 7D may be modified, exchanged, or replaced. For example, the successive forming of oxide layers 51 and 53 may be replaced with a step of forming a single oxide layer. The implantation may be performed to form area 55 after having formed thermal oxide layer 53.

Such alterations, modifications, and improvements are intended to be part of this disclosure, and are intended to be within the spirit and the scope of the present invention. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A structure, comprising:
photodiodes formed in a first semiconductor layer of a first conductivity type;
a doped semiconductor substrate of the second conductivity type, the first semiconductor layer extending on the semiconductor substrate;
an insulating structure formed in a trench crossing the first semiconductor layer, the trench having walls, the insulating structure including:
a first insulating layer coating the walls of the trench;
a conductive material filling the trench; and
a doped area of the second conductivity type surrounding the trench, the doped area being more heavily doped than the first semiconductor layer; and
a contact electrically coupled with the conductive material and a zero bias voltage terminal, wherein the photodiodes include a second semiconductor layer positioned on the first semiconductor layer such that the first semiconductor layer is positioned between the semiconductor substrate and the second semiconductor layer, the second semiconductor layer being more heavily doped than the semiconductor substrate, and the doped area extending between and contacting the second semiconductor layer and the first insulating layer.

2. The structure of claim 1, wherein the first insulating layer has a thickness greater than 25 nm.

3. The structure of claim 1, wherein the first insulating layer comprises a thermal oxide layer, a deposited oxide layer, and a silicon nitride layer.

4. The structure of claim 1, wherein the conductive material is doped polysilicon.

5. The structure of claim 1, wherein the first conductivity type is type N.

6. The structure of claim 1, wherein the doped area extends in the substrate and forms the walls and a bottom of the trench.

7. The structure of claim 1, further comprising a second insulating layer positioned on the first semiconductor layer and the doped area, the trench extending through the second insulating layer, and the first insulating layer coating a sidewall of the second insulating layer.

8. The structure of claim 1, wherein the trench extends completely through the first semiconductor layer and into a portion of the semiconductor substrate, the portion being directly below the first semiconductor layer.

9. A structure, comprising:
a first semiconductor layer of a first conductivity type;
a doped semiconductor substrate of the second conductivity type, the first semiconductor layer extending on the semiconductor substrate;
an insulating structure formed in a trench crossing the first semiconductor layer, the trench having walls, the insulating structure including:
a first insulating layer coating the walls of the trench;
a conductive material filling the trench; and
a doped area of the second conductivity type forming the walls of the trench, the doped area being more heavily doped than the first semiconductor layer; and
a contact electrically coupled with the conductive material and a zero bias voltage terminal, wherein the structure includes a second semiconductor layer positioned on the first semiconductor layer such that the first semiconductor layer is positioned between the semiconductor substrate and the second semiconductor layer, the second semiconductor layer being more heavily doped than the semiconductor substrate, and the doped area extending between and contacting the second semiconductor layer and the first insulating layer.

10. The structure of claim 9, wherein the first insulating layer comprises a thermal oxide layer, a deposited oxide layer, and a silicon nitride layer.

11. The structure of claim 9, wherein the conductive material is doped polysilicon.

12. The structure of claim 9, wherein the first conductivity type is type N.

13. The structure of claim 9, wherein the doped area extends in the substrate and forms the walls and a bottom of the trench.

14. The structure of claim 9, further comprising a second insulating layer positioned on the first semiconductor layer and the doped area, the trench extending through the second insulating layer, and the first insulating layer coating a sidewall of the second insulating layer.

15. The structure of claim 9, wherein the trench extends completely through the first semiconductor layer and into a portion of the semiconductor substrate, the portion being directly below the first semiconductor layer.

16. A structure, comprising:
a first semiconductor layer of a first conductivity type;
a photodiode positioned in the first semiconductor layer;
a semiconductor substrate of the second conductivity type, the first semiconductor layer extending on the semiconductor substrate; and
an insulating structure formed in a trench extending through the first semiconductor layer and into the semiconductor substrate, the trench having walls, the insulating structure including:
a first insulating layer coating the walls of the trench;
a conductive material filling the trench; and
a doped area of the second conductivity type surrounding the trench, the doped area being more heavily doped than the first semiconductor layer, wherein the photodiode includes a second semiconductor layer positioned on the first semiconductor layer such that the first semiconductor layer is positioned between the semiconductor substrate and the second semiconductor layer, the second semiconductor layer being more heavily doped than the semiconductor substrate, and the doped area extending between and contacting the second semiconductor layer and the first insulating layer.

17. The structure of claim 16, further comprising a contact electrically coupled with the conductive material and a zero bias voltage terminal.

18. The structure of claim 16, wherein the doped area extends in the substrate and forms the walls and a bottom of the trench.

19. The structure of claim 16, further comprising a second insulating layer positioned on the first semiconductor layer and the doped area, the trench extending through the second insulating layer, and the first insulating layer coating a sidewall of the second insulating layer.

* * * * *